United States Patent
Furuya et al.

(10) Patent No.: US 8,778,812 B2
(45) Date of Patent: Jul. 15, 2014

(54) APPARATUS AND METHOD OF FORMING THIN FILM INCLUDING ADSORPTION STEP AND REACTION STEP

(71) Applicant: Tokyo Electron Limited, Tokyo (JP)

(72) Inventors: Haruhiko Furuya, Yamanashi (JP); Jun Ogawa, Iwate (JP); Masahiko Kaminishi, Iwate (JP); Yoshinobu Ise, Iwate (JP); Yoshitaka Enoki, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 47 days.

(21) Appl. No.: 13/726,724

(22) Filed: Dec. 26, 2012

(65) Prior Publication Data
US 2013/0164945 A1 Jun. 27, 2013

(30) Foreign Application Priority Data
Dec. 27, 2011 (JP) ................................. 2011-285848

(51) Int. Cl.
*H01L 21/469* (2006.01)
*H01L 21/02* (2006.01)

(52) U.S. Cl.
CPC ...... *H01L 21/02189* (2013.01); *H01L 21/0228* (2013.01); *H01L 21/02205* (2013.01)
USPC ........... 438/763; 438/761; 438/758; 118/725; 118/723 R

(58) Field of Classification Search
None
See application file for complete search history.

(56) References Cited

U.S. PATENT DOCUMENTS

| 2006/0177579 A1* | 8/2006 | Shin et al. ................. 427/248.1 |
| 2010/0055314 A1* | 3/2010 | Kato et al. ............... 427/255.28 |
| 2010/0260936 A1* | 10/2010 | Kato et al. ............... 427/255.28 |
| 2010/0320520 A1 | 12/2010 | Nakagawa et al. |

FOREIGN PATENT DOCUMENTS

| JP | 2011-018707 | 1/2011 |
| WO | WO 2008/108128 | 9/2008 |

* cited by examiner

*Primary Examiner* — Charles Garber
*Assistant Examiner* — Brigitte Paterson
(74) *Attorney, Agent, or Firm* — IPUSA, PLLC

(57) ABSTRACT

A film deposition method includes an adsorption step of adsorbing a first reaction gas onto a substrate by supplying the first reaction gas from a first gas supplying portion for a predetermined period without supplying a reaction gas from a second gas supplying portion while separating a first process area and a second process area by supplying a separation gas from a separation gas supplying portion and rotating a turntable; and a reaction step of having the first reaction gas adsorbed onto the substrate react with a second reaction gas by supplying the second reaction gas from the second gas supplying portion for a predetermined period without supplying a reaction gas from the first gas supplying portion while separating the first process area and the second process area by supplying the separation gas from the separation gas supplying portion and rotating the turntable.

12 Claims, 11 Drawing Sheets

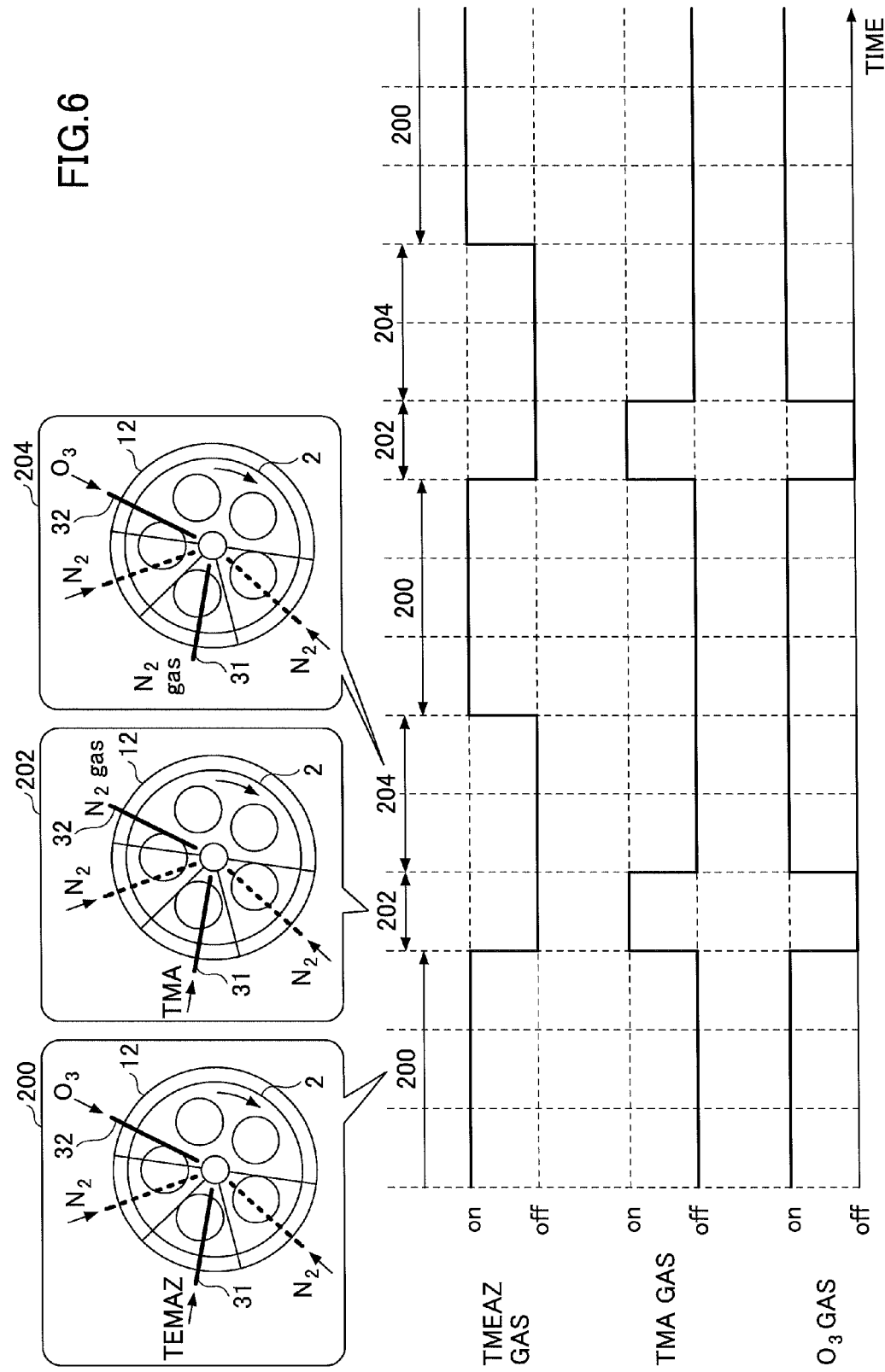

APPARATUS AND METHOD OF FORMING THIN FILM INCLUDING ADSORPTION STEP AND REACTION STEP

CROSS-REFERENCE TO RELATED APPLICATION

The present application is based on Japanese Priority Application No. 2011-285848 filed on Dec. 27, 2011, the entire contents of which are hereby incorporated herein by reference.

BACKGROUND OF THE INVENTION

1. Field of the Invention

The present invention relates to a film deposition method.

2. Description of the Related Art

Recently, a requirement of increasing the memory capacity of a semiconductor memory device has been increased. Thus, a high dielectric material has been used for an insulating layer of a memory cell of the high dielectric semiconductor memory device. For one of such materials, zirconium oxide (ZrO) is known. ZrO has a relative dielectric constant of around 24 to 40, however, ZrO has a problem that a withstand voltage is low. Thus, in order to increase the withstand voltage, aluminum (Al) is added to ZrO (Patent Document 1 and Patent Document 2, for example).

In order to reduce a cost of manufacturing a semiconductor memory device, a semiconductor wafer (hereinafter simply referred to as a "wafer") with a larger diameter has been used. With this, it is necessary to improve across-the-wafer uniformity. In accordance with such a requirement, a film deposition method so-called "Atomic Layer Deposition" (ALD) or "Molecular Layer Deposition" (MLD) is expected. In ALD, a thin film of a reaction product is formed on a surface of a wafer by repeating a cycle in which a reaction gas A is adsorbed onto the surface of the wafer, and the adsorbed reaction gas A is reacted with another reaction gas B which reacts with the reaction gas A. As ALD uses adsorption of reaction gasses onto a surface of a wafer, there are advantages in ALD that the thickness across-the-wafer uniformity can be obtained and the thickness can be preferably controlled.

When ALD is performed in a vertical batch film deposition apparatus, first, a reaction gas A is introduced into a process tube chamber in which plural wafers are placed for a predetermined period to have the reaction gas A adsorbed onto the surface of the wafer. Then, the reaction gas A is evacuated from the process tube chamber while supplying a purge gas to purge the reaction gas A from the process tube chamber. Subsequently, a reaction gas B is introduced into the process tube chamber for a predetermined period to have the reaction gas A and the reaction gas B react on the surface of the wafer so that a reaction product is formed on the surface of the wafer. These steps are repeated until a thin film with a predetermined thickness is formed.

When ALD is performed in the batch film deposition apparatus, as described above, supplying of the reaction gas A, evacuation/purging of the reaction gas A, supplying of the reaction gas B, and evacuation/purging of the reaction gas B are performed. Thus, the process time becomes long as it is necessary to change the reaction gas A and the reaction gas B to be introduced and evacuation/purging are performed between changing the reaction gasses.

On the other hand, a film deposition apparatus with a turntable is known. Such a film deposition apparatus includes a turntable which is rotatably provided in a vacuum chamber, a supplying area of the reaction gas A, a supplying area of the reaction gas B, and separation areas for separating the supplying areas, respectively, provided above the turntable, evacuation ports corresponding to the supplying areas of the reaction gas A and the reaction gas B, respectively, and evacuation devices connected to the evacuation ports, respectively.

In such a film deposition apparatus, plural wafers mounted on the turntable pass the supplying area of the reaction gas A, the separation area, the supplying area of the reaction gas B, and the separation area in this order by rotating the turntable. With this, the reaction gas A is adsorbed onto the surface of the wafers at the supplying area of the reaction gas A, and the reaction gas A and the reaction gas B are reacted at the supplying area of the reaction gas B. Therefore, it is unnecessary to change the supplying of the reaction gas A and the reaction gas B while depositing the film and the reaction gas A and the reaction gas B can be continuously supplied. Thus, the evacuation/purging steps are unnecessary to reduce the process time.

When forming a ZrO film to which aluminum (Al) is added (which will be referred to as an "Al doped ZrO film" hereinafter) using the film deposition apparatus with the turntable, Al can be doped into ZrO by mixing a reaction gas containing Zr (Zr source gas) and a reaction gas containing Al (Al source gas) in a pipe. However, at this time, if the Zr source gas and the Al source gas are supplied onto the wafer before being mixed to be a uniform concentration, the added amount of Al cannot be made uniform in-plane on the wafer.

Further, the Al doped ZrO film can be formed by controlling supplying of the Zr source gas and the Al source gas so that an AlO film is inserted between ZrO films. However, this may cause a difference in the added amount of Al between plural wafers or within each of the wafers based on the supply timing of the Al source gas.

Further, when adding Al to ZrO, although the withstand voltage is improved, the relative dielectric constant tends to become lower. Thus, it is necessary to add a slight amount of Al to ZrO while maintaining across-the-wafer uniformity.

PATENT DOCUMENT

[Patent Document 1] WO2008/108128
[Patent Document 2] Japanese Laid-open Patent Publication No. 2011-18707

SUMMARY OF THE INVENTION

The present invention is made in light of the above problems, and provides a film deposition method capable of improving controllability and uniformity of an added amount.

According to an embodiment, there is provided a film deposition method of forming a first thin film of a reaction product of a first reaction gas and a second reaction gas on a substrate, performed in a film deposition apparatus. The film deposition apparatus includes, a turntable rotatably provided in a vacuum chamber and having plural mounting portions on each of which a substrate is to be mounted, a first gas supplying portion to supply a reaction gas to a first process area on the surface of the turntable, a second gas supplying portion to supply a reaction gas to a second process area which is apart from the first process area along a circumferential direction on the surface of the turntable, and a separation gas supplying portion to supply a separation gas to separation areas provided between the first process area and the second process area on the surface of the turntable. The method includes an adsorption step of adsorbing the first reaction gas onto the substrate by supplying the first reaction gas from the first gas supplying portion for a predetermined period without supplying a reaction gas from the second gas supplying portion while separating the first process area and the second process area by supplying the separation gas from the separation gas supplying portion and rotating the turntable; and a reaction step of having the first reaction gas adsorbed onto the substrate react with the second reaction gas by supplying the second reaction gas from the second gas supplying portion for a predetermined period without supplying a reaction gas from the first gas supplying portion while separating the first process area and the second process area by supplying the separation gas from the separation gas supplying portion and rotating the turntable.

Note that also arbitrary combinations of the above-described constituents, and any exchanges of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

FIG. 6 is a view showing timing charts of a film deposition method;

DETAILED DESCRIPTION OF THE PREFERRED EMBODIMENTS

Figure 1:
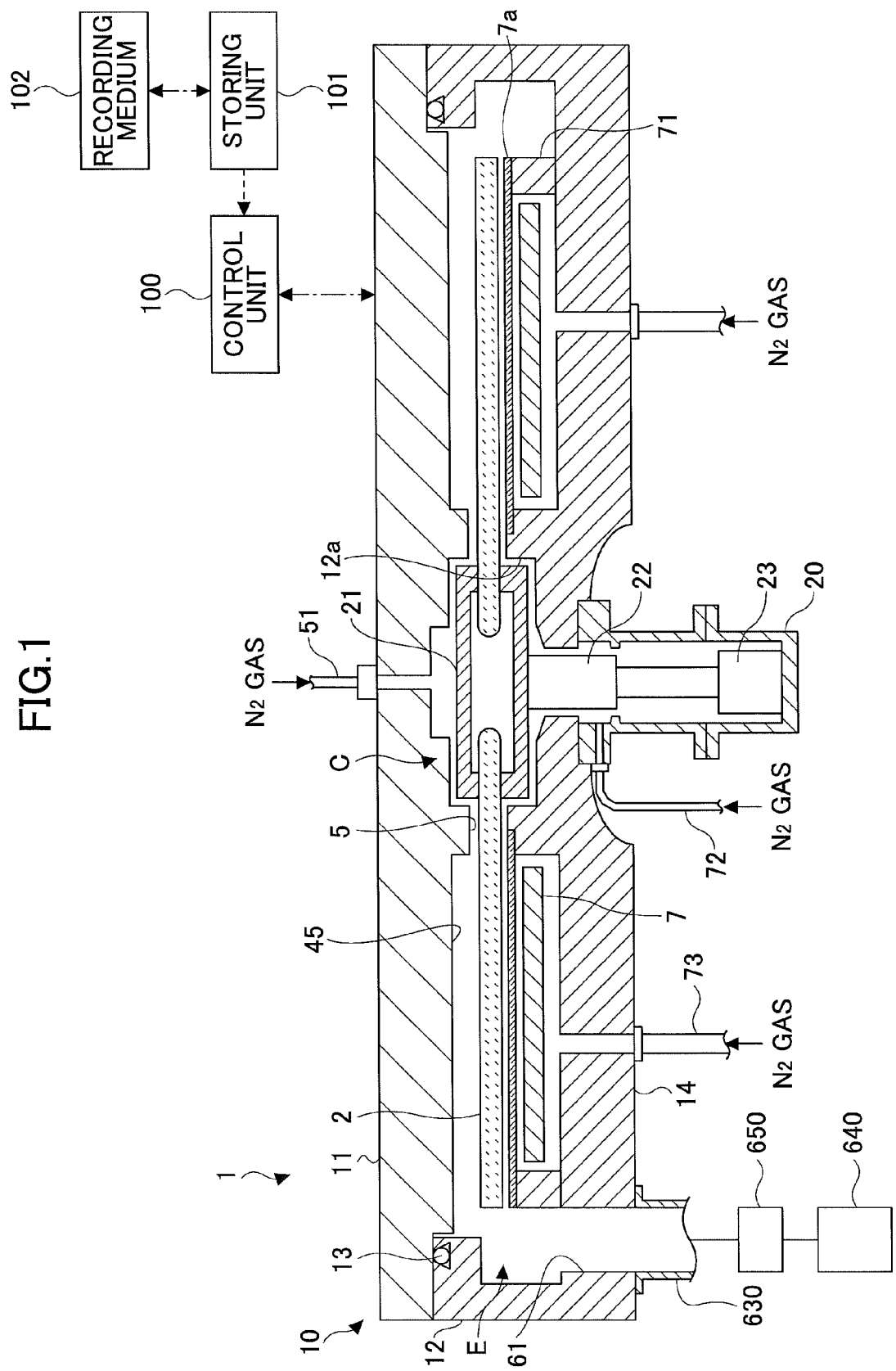
FIG. 1 is a cross-sectional view of an example of a film deposition apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated. Further, drawings are not intended to show relative ratios of a component or components.

In this embodiment, a film deposition method in which Al is added as an impurity to a ZrO film, which is an example of a high dielectric film, is explained as an example.
(Film Deposition Apparatus)

First, a film deposition apparatus for performing a film deposition method of the embodiment is explained.

FIG. 1 is a cross-sectional view of an example of a film deposition apparatus 1 of the embodiment.

The film deposition apparatus 1 includes a vacuum chamber 10, a turntable 2, a heater unit 7, a case body 20, a core unit 21, a rotary shaft 22, and a driving unit 23. The vacuum chamber 10 has a substantially flat circular shape. The vacuum chamber 10 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 10 and has a center of rotation at the center of the vacuum chamber 10. The turntable 2 is attached to the cylindrical shaped core unit 21 at its center portion. The core unit 21 is fixed to the upper end of the rotary shaft 22 which is extending in the vertical direction. The rotary shaft 22 is provided to penetrate the bottom portion 14 of the vacuum chamber 10 and the lower end of which is attached to the driving unit 23 that rotates the rotary shaft 22 (FIG. 1) around a vertical direction. The rotary shaft 22 and the driving unit 23 are housed in the tubular case body 20 whose upper surface is open. The case body 20 is attached to a lower surface of the bottom portion 14 of the vacuum chamber 10 via a flange portion provided at its upper surface in an airtight manner so that inner atmosphere of the case body 20 is isolated from outside atmosphere.

Figure 2:
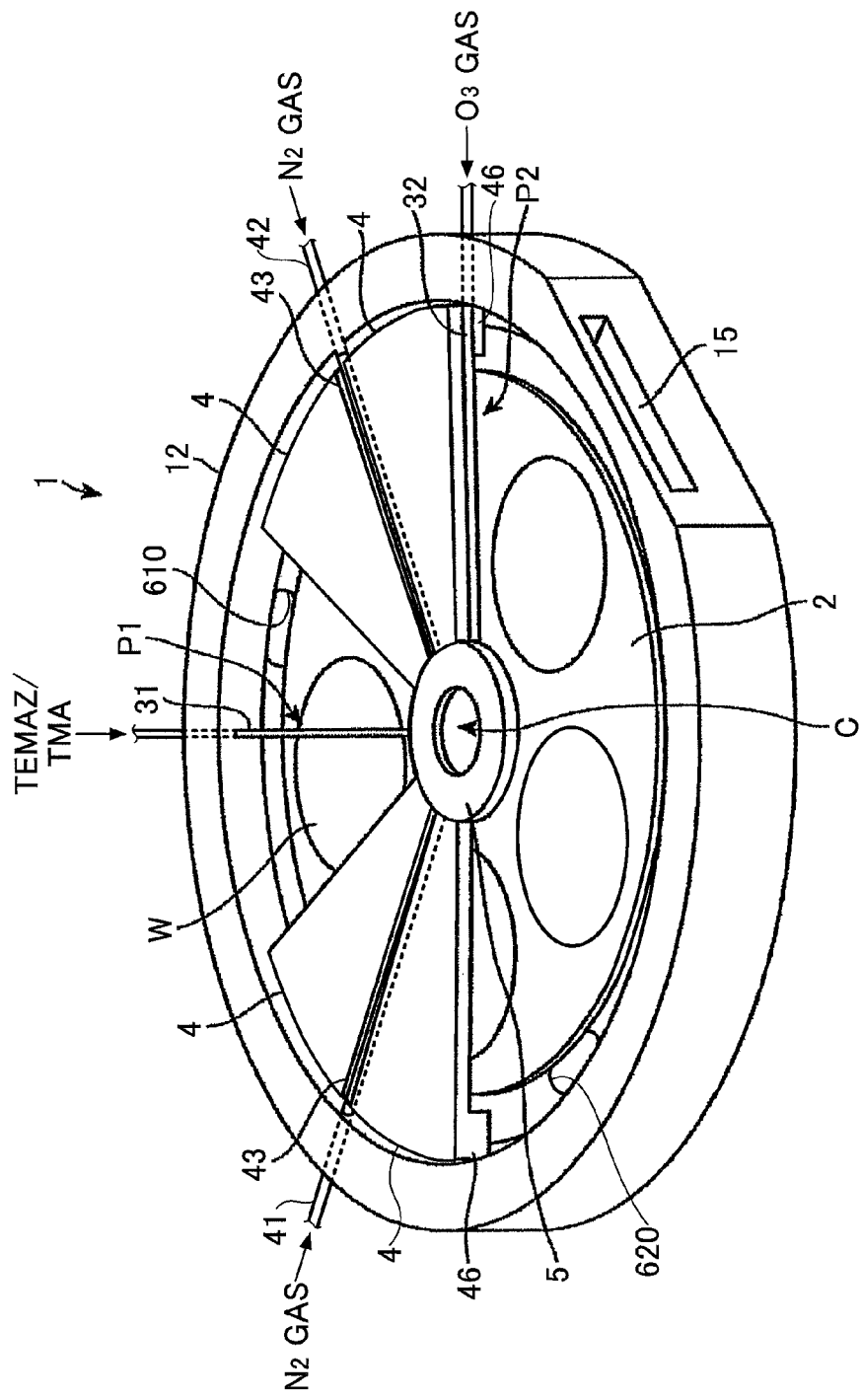
FIG. 2 is a perspective view showing an inside structure of a vacuum chamber of the film deposition apparatus shown in FIG. 1.
Figure 3:
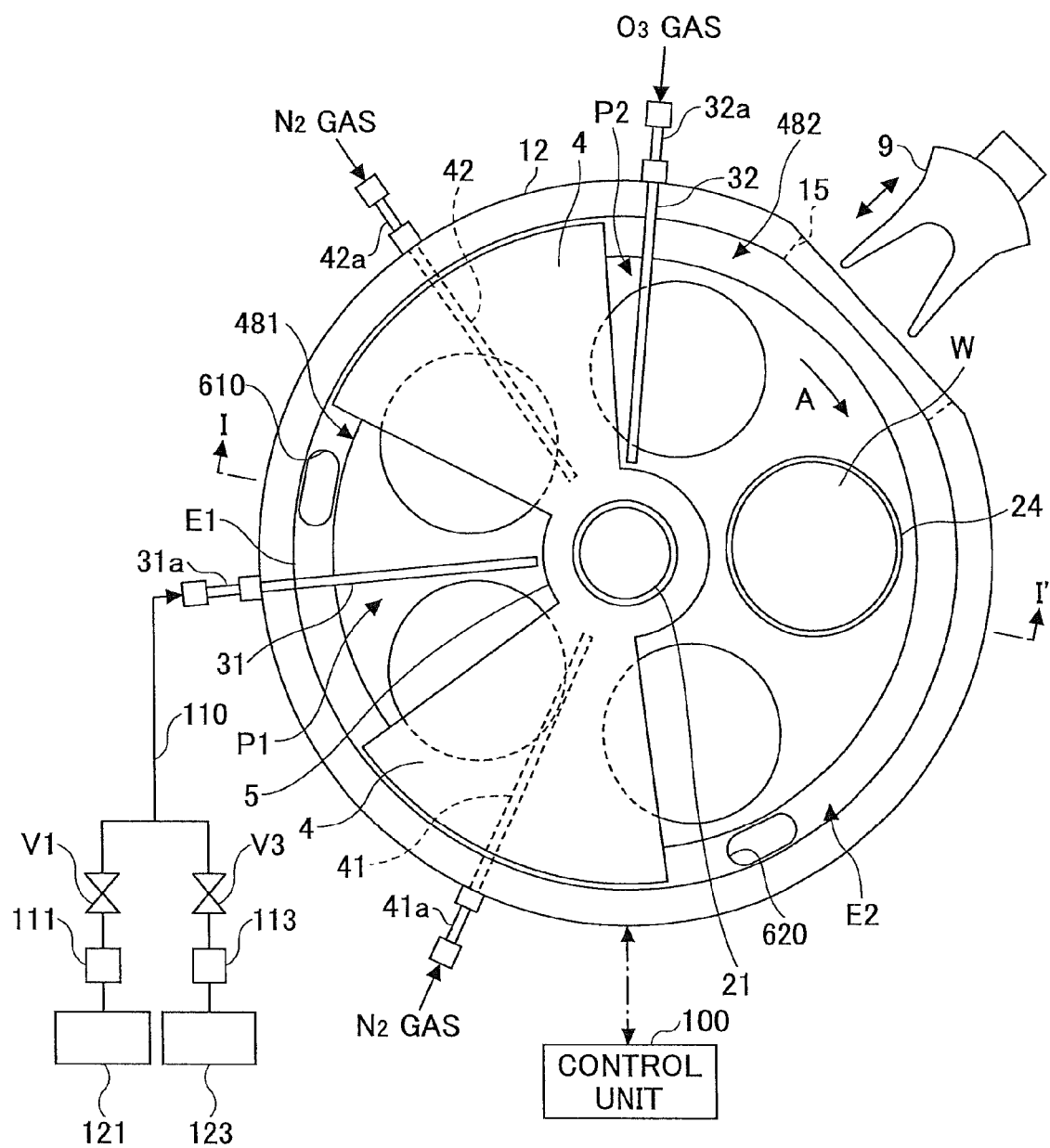
FIG. 3 is a schematic top view showing an example of the vacuum chamber of the film deposition apparatus shown in FIG. 1.

FIG. 2 and FIG. 3 are views showing an inside structure of the vacuum chamber 10. The ceiling plate 11 is not shown in FIG. 2 and FIG. 3 for an explanatory purpose.

As shown in FIG. 2 and FIG. 3, plural (five in this case) circular concave portions 24 are provided at a front surface of the turntable 2 along a rotating direction (circumferential direction) shown by an arrow A for placing plural semiconductor wafers (which will be simply referred to as "wafers" hereinafter) W, respectively. Here, an example where the wafer W is shown to be placed in one of the concave portions 24 in FIG. 3 for an explanatory purpose.

Each of the concave portions 24 is formed to have a slightly larger (for example, 4 mm larger) diameter than that (for example, 300 mm) of the wafer W, and a depth substantially equal to the thickness of the wafer W. Thus, when the wafer W is mounted in the respective concave portion 24, the surface of the wafer W and the surface of the turntable 2 (where the wafer W is not mounted) becomes almost the same height.

A reaction gas nozzle 31, a reaction gas nozzle 32, and separation gas nozzles 41 and 42, which are made of quartz, for example, are provided above the turntable 2. For the example shown in FIG. 3, the separation gas nozzle 41, the reaction gas nozzle 31, the separation gas nozzle 42, and the reaction gas nozzle 32 are aligned in this order from a transfer port 15 (which will be explained later) in a clockwise direction (the rotation direction of the turntable 2) with a space therebetween in a circumferential direction of the vacuum chamber 10. Gas introduction ports 31a, 32a, 41a, and 42a (FIG. 3) which are base portions of the nozzles 31, 32, 41, and 42, respectively, are fixed to an outer periphery wall of the fixing chamber body 12 so that these nozzles 31, 32, 41, and 42 are introduced into the vacuum chamber 10 from the outer periphery wall of the vacuum chamber 10 to extend in parallel with respect to a surface of the turntable 2.

In this embodiment, a main reaction gas (an example of a third reaction gas) and an additional reaction gas (an example of a first reaction gas) are alternately supplied from the reaction gas nozzle 31. As shown in FIG. 3, a pipe 110 is connected to the gas introduction port 31a of the reaction gas nozzle 31. The pipe 110 is branched into two branched pipes via a predetermined joint. A first gas supplying source 121 that supplies the main reaction gas is connected to one of the branched pipes via an open valve V1 and a flow-controller 111 (a mass flow controller, for example) and a second gas supplying source 123 that supplies the additional reaction gas is connected to the other of the branched pipes via an open valve V3 and a flow-controller 113.

In this embodiment, the first gas supplying source 121 supplies a Zr containing organometallic gas (or steam, the same in the following), which is a reaction gas containing zirconium (Zr), as the main reaction gas. In this embodiment, Tetrakis (Ethylmethylamino) Zirconium (TEMAZ) is used as the Zr containing organometallic gas.

The second gas supplying source 123 supplies an Al containing organometallic gas, which is a reaction gas containing aluminum (Al), as the additional reaction gas. In this embodiment, Trimethyl Aluminum (TMA) is used as the Al containing organometallic gas.

By complementary opening and closing the open valves V1 and V3, either one of the TEMAZ gas and the TMA gas is supplied into the vacuum chamber 10 from the reaction gas nozzle 31.

A supplying source (not shown in the drawings) which supplies ozone ($O_3$) gas (an example of a second reaction gas and a fourth reaction gas), which oxidizes the TEMAZ gas and the TMA gas to form a ZrO film and an AlO film, respectively, is connected to the reaction gas nozzle 32 via an open valve and a flow-controller (both are not shown in the drawings).

Further, supplying sources (not shown in the drawings) which supply a noble gas such as Ar or He, an inactive gas such as nitrogen gas are connected to the separation gas nozzles 41 and 42 via open valves and flow-controllers (both are not shown in the drawings), respectively. In this embodiment, $N_2$ gas is used.

The reaction gas nozzles 31 and 32 are provided with plural gas discharge holes 33 (see FIG. 4) which are facing downward to the turntable 2 along the longitudinal directions of the reaction gas nozzles 31 and 32 with a 10 mm interval, respectively, for example. An area below the reaction gas nozzle 31 is a first process area P1 in which the TEMAZ gas or the TMA gas is adsorbed onto the wafers W. An area below the reaction gas nozzle 32 is a second process area P2 in which the TEMAZ gas or the TMA gas adsorbed onto the wafers W at the first process area P1 is oxidized.

Referring to FIG. 2 and FIG. 3, the ceiling plate 11 is provided with two protruding portions 4 protruding in the vacuum chamber 10. Each of the protruding portions 4 has substantially a sector top view shape where the apex is removed in an arc shape. For each of the protruding portions 4, the inner arc shaped portion is connected to an inner protruding portion 5 (which will be explained later with reference to FIG. 1 to FIG. 3) and the outer arc shaped portion is formed to extend along an inner peripheral surface of the chamber body 12 of the vacuum chamber 10.

Figure 4:
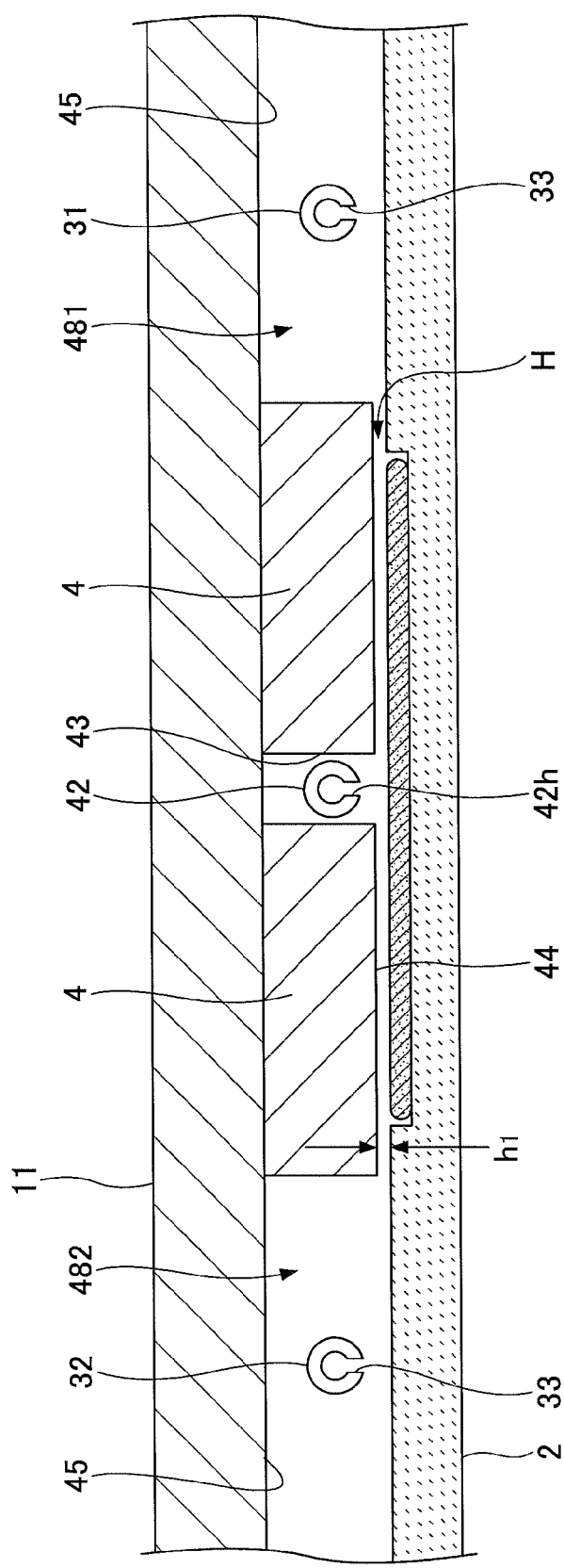
FIG. 4 is a partial cross-sectional view of an example of the film deposition apparatus shown in FIG. 1.

FIG. 4 shows a cross-section of the vacuum chamber 10 along a concentric circle of the turntable 2 from the reaction gas nozzle 31 to the reaction gas nozzle 32. As shown in FIG. 4, the protruding portion 4 is fixed to a lower surface of the ceiling plate 11. Thus, there are provided a flat low ceiling surface 44 (first ceiling surface) formed below the respective protruding portion 4 and flat higher ceiling surfaces 45 (second ceiling surface) which are higher than the low ceiling surface 44 and formed at outboard sides of the respective low ceiling surface 44 in the circumferential direction.

Further, as shown in the drawings, the protruding portion 4 is provided with a groove portion 43 at a center in the circumferential direction. The groove portion 43 is formed to extend in the radius direction of the turntable 2. The separation gas nozzle 42 is positioned within the groove portion 43. Although not shown in FIG. 4, the separation gas nozzle 41 is also positioned within a groove portion provided in the other protruding portion 4. The separation gas nozzle 42 is provided with plural gas discharge holes 42h formed along the longitudinal direction of the separation gas nozzle 42 with a predetermined interval (10 mm, for example). An opening diameter of each of the gas discharge holes is 0.3 mm to 1.0 mm, for example. Although not shown in the drawings, the separation gas nozzle 41 is similarly provided with plural gas discharge holes.

The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, for an explanatory purpose, a space below the high ceiling surface 45 where the reaction gas nozzle 31 is provided is referred to as "481" and a space below the high ceiling surface 45 where the reaction gas nozzle 32 is provided is referred to as "482" as shown in FIG. 4.

The low ceiling surface 44 provides a separation space H, which is a small space, with respect to the turntable 2. When the $N_2$ gas is provided from the separation gas nozzle 42, the $N_2$ gas flows toward the space 481 and the space 482 through the separation space H. At this time, as the volume of the separation space H is smaller than those of the spaces 481 and 482, the pressure in the separation space H can be made higher than those in the spaces 481 and 482 by the $N_2$ gas. It means that between the spaces 481 and 482, the separation space H provides a pressure barrier. Further, the $N_2$ gas flowing from the separation space H toward the spaces 481 and 482 functions as a counter flow against the TEMAZ gas or the TMA from the gas first process area P1 and the $O_3$ gas from the second process area P2. Thus, the TEMAZ gas or the TMA gas from the first process area P1 and the $O_3$ gas from the second process area P2 are separated by the separation space H. Therefore, mixing and reacting of the TEMAZ gas or the TMA gas with the $O_3$ gas are prevented in the vacuum chamber 10.

The height h1 of the low ceiling surface 44 above an upper surface of the turntable 2 may be appropriately determined based on the pressure of the vacuum chamber 10 at a film deposition, the rotational speed of the turntable 2, and a supplying amount of the separation gas ($N_2$ gas) in order to maintain the pressure in the separation space H higher than those in the spaces 481 and 482.

Referring to FIG. 1 to FIG. 3, the ceiling plate 11 is further provided with the inner protruding portion 5 at its lower surface to surround the outer periphery of the core unit 21 which fixes the turntable 2. The inner protruding portion 5 is continuously formed with the inner portion of the protruding portions 4 and a lower surface which is formed at the same height as those of the low ceiling surfaces 44, in this embodiment.

Figure 5:
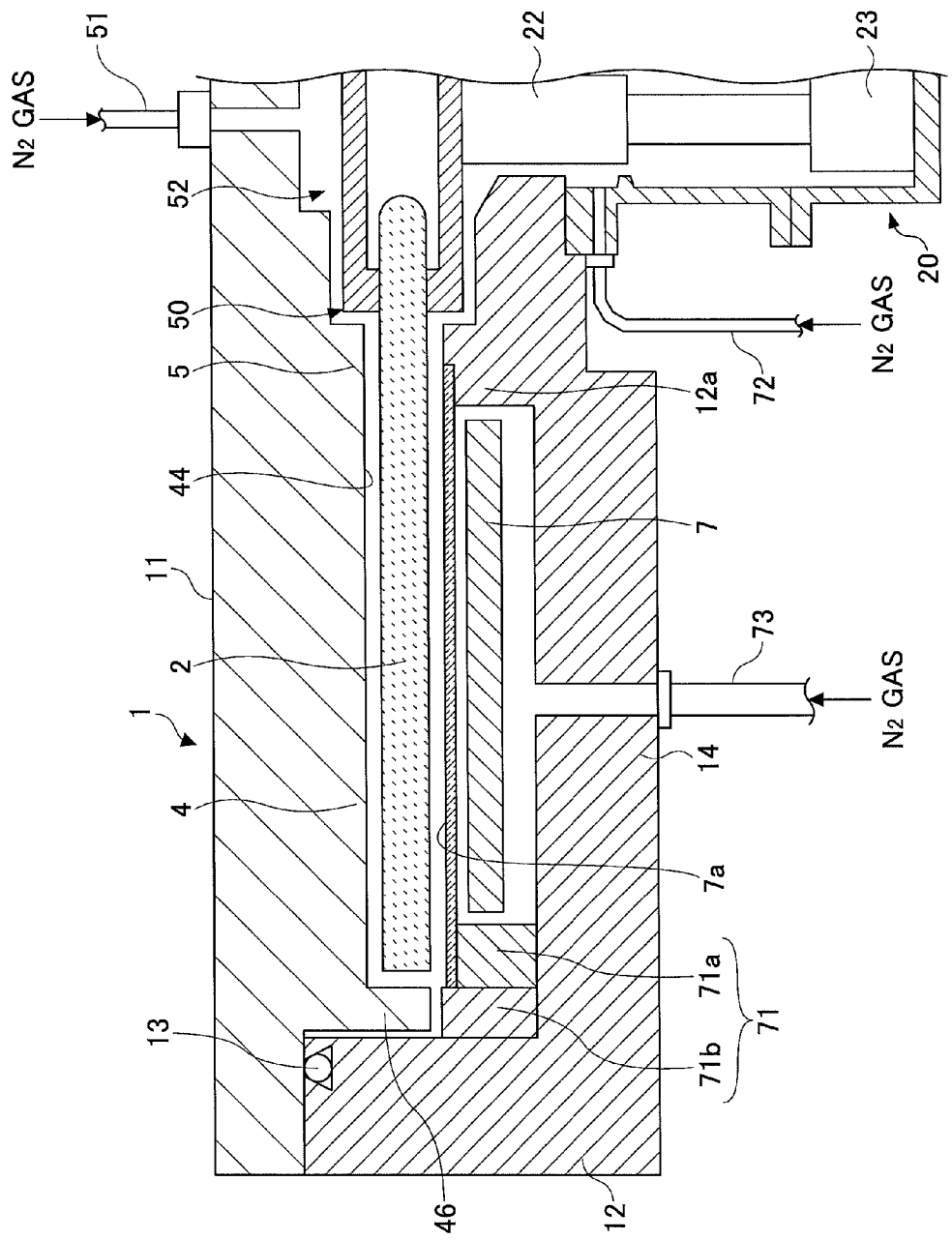
FIG. 5 is a partial cross-sectional view of an example of the film deposition apparatus shown in FIG. 1

FIG. 1 is a cross-sectional view taken along an I-I' line in FIG. 3, and showing an area where the ceiling surface 45 is provided. FIG. 5 is a partial cross-sectional view showing an area where the ceiling surface 44 is provided.

As shown in FIG. 5, the protruding portion 4 having a substantially sector top view shape is provided with an outer bending portion 46 at its outer peripheral end portion (at an outer peripheral end portion side of the vacuum chamber 10) which is bent to have an L-shape to face an outer end surface of the turntable 2. The outer bending portion 46 suppresses a flow of gas between the space 481 and the space 482 through the space between the turntable 2 and the inner peripheral surface of the chamber body 12. As described above, the protruding portions 4 are attached to the ceiling plate 11 and the ceiling plate 11 is detachably attached to the chamber body 12. Thus, there is a slight space between the outer periphery surface of the outer bending portion 46 and the chamber body 12. The space between the inner periphery surface of the outer bending portion 46 and an outer surface of the turntable 2, and the space between the outer periphery surface of the outer bending portion 46 and the chamber body 12 may be a size the same as the height h1 (see FIG. 4) of the low ceiling surface 44 with respect to the upper surface of the turntable 2, for example.

Referring to FIG. 3, the film deposition apparatus 1 further includes a first evacuation port 610 and a second evacuation port 620 which are in communication with the space 481 and the space 482, respectively, provided between the turntable 2 and the inner peripheral surface of the chamber body 12. The first evacuation port 610 and the second evacuation port 620 are connected to vacuum pumps 640, which are vacuum evacuation units, via evacuation pipes 630, respectively, as shown in FIG. 1. The reference numeral 650 is a pressure regulator in FIG. 1.

The heater unit 7 is provided at a space between the turntable 2 and the bottom portion 14 of the vacuum chamber 10 as shown in FIG. 1 and FIG. 5. The wafers W mounted on the turntable 2 are heated by the heater unit 7 via the turntable 2 to be a temperature (450° C., for example) determined by a process recipe. A ring cover member 71 is provided at a lower portion side of the outer periphery of the turntable 2 in order to prevent gasses are prevented from being introduced into the space below the turntable 2.

As shown in FIG. 5, the cover member 71 includes an inner member 71a which is provided to face the outer edge portion and the further outer portion of the turntable 2 from a lower side, and an outer member 71b which is provided between the inner member 71a and an inner wall surface of the chamber body 12. The outer member 71b is provided to face the outer bending portion 46, which is formed at an outer edge portion at lower side of each of the protruding portions 4. The inner member 71a is provided to surround the entirety of the heater unit 7 below the outer end portion (and at a slightly outer side of the outer end portion) of the turntable 2.

As shown in FIG. 1, the bottom portion 14 of the vacuum chamber 10 closer to the rotation center than the space where the heater unit 7 is positioned protrudes upward to be close to the core unit 21 to form a protruded portion 12a. There is provided a small space between the protruded portion 12a and the core unit 21. Further, there is provided a small space between an inner peripheral surface of the bottom portion 14 and the rotary shaft 22 to be in communication with the case body 20. A purge gas supplying pipe 72 which supplies $N_2$ gas as the purge gas to the small space for purging is provided in the case body 20. The bottom portion 14 of the vacuum chamber 10 is provided with plural purge gas supplying pipes 73 (only one of the purge gas supplying pipes 73 is shown in FIG. 5) which are provided with a predetermined angle interval in the circumferential direction below the heater unit 7 for purging the space where the heater unit 7 is provided. Further, a cover member 7a is provided between the heater unit 7 and the turntable 2 to prevent the gas from being introduced into the space where the heater unit 7 is provided. The cover member 7a is provided to extend from an inner peripheral wall (upper surface of the inner member 71a) of the outer member 71b to an upper end portion of the protruded portion 12a in the circumferential direction. The cover member 7a may be made of quartz, for example.

When the $N_2$ gas is supplied from the purge gas supplying pipe 72, the $N_2$ gas flows through the space between the turntable 2 and the cover member 7a through the space between the inner peripheral surface of the protruded portion 12a and the rotary shaft 22, and the space between the protruded portion 12a and the core unit 21 to be evacuated from the first evacuation port 610 or the second evacuation port 620 (FIG. 3). Further, when the $N_2$ gas is supplied from the purge gas supplying pipe 73, the $N_2$ gas flows through the space where the heater unit 7 is provided and a space (not shown in the drawings) between the cover member 7a and the inner member 71a to be evacuated from the first evacuation port 610 or the second evacuation port 620 (FIG. 3). By these flows of the $N_2$ gas, mixing of gasses in the space 481 and the space 482 via the space at a center and lower portion of the vacuum chamber 10 and the space below the turntable 2 can be prevented.

The film deposition apparatus 1 further includes a separation gas supplying pipe 51 which is connected to a center portion of the ceiling plate 11 of the vacuum chamber 10 and provided to supply $N_2$ gas as the separation gas to the space 52 between the ceiling plate 11 and the core unit 21. The separation gas supplied to the space 52 flows through a small space between the inner protruding portion 5 and the turntable 2 to flow along a front surface of the turntable 2 where the wafers W are to be mounted to be discharged from an outer periphery. The space 50 is kept at a pressure higher than those of the space 481 and the space 482 by the separation gas. Thus, the mixing of the TEMAZ gas or the TMA gas supplied to the first process area P1 and the $O_3$ gas supplied to the second process area P2 by flowing through the center area C can be prevented by the space 50. It means that the space 50 (or the center area C) can function similarly as the separation space H.

Further, as shown in FIG. 2 and FIG. 3, a transfer port 15 is provided at a sidewall of the vacuum chamber 10 for allowing the wafers W, which are substrates, to pass between an external transfer arm 9 and the turntable 2. The transfer port 15 is opened and closed by a gate valve (not shown in the drawings). Further, lift pins, which penetrate the concave portion 24 to lift up the respective wafer W from a backside surface, and a lifting mechanism for the lift pins (both are not shown in the drawings) are provided at a respective portion below the turntable 2. Thus, the respective wafer W is passed between the external transfer arm 9 and the concave portion 24 of the turntable 2, which is a mounting portion, at a place facing the transfer port 15.

As shown in FIG. 1, the film deposition apparatus 1 of the embodiment further includes a control unit 100 which controls the entirety of the film deposition apparatus 1 and a storing unit 101. The control unit 100 may be a computer. The storing unit 101 stores a program by which the film deposition apparatus 1 executes the film deposition method (as will be explained later) under control of the control unit 100. The program is formed to include steps capable of executing the film deposition method. The storing unit 101 may be a hard disk or the like, for example. The program stored in the storing unit 101 may be previously stored in a recording medium 102 such as a compact disk (CD), a magneto-optical disk, a memory card, a flexible disk, or the like to be installed in the storing unit 101 using a predetermined reading device.
(Film Deposition Method)

Next, the film deposition method of the embodiment using the film deposition apparatus 1 is explained with reference to FIGS. 6A to 6C in addition to the drawings previously explained.

(Wafer Transferring Step)

First, the gate valve (which is not shown in the drawings) is opened, and the wafer W is passed to the concave portion 24 of the turntable 2 via the transfer port 15 (FIG. 3) by the transfer arm 9. This operation is performed by lifting the lift pins (not shown in the drawings) via through holes provided at a bottom surface of the concave portion 24 from the bottom portion side of the vacuum chamber 10 when the concave portion 24 stops at a position facing the transfer port 15. By repeating this operation while intermittently rotating the turntable 2, the wafers W are mounted within the concave portions 24, respectively.

(Preliminary Step)

Then, the gate valve is closed, and the vacuum chamber 10 is evacuated by the vacuum pump 640 to the minimum vacuum level. Then, the $N_2$ gas as the separation gas is discharged from the separation gas nozzles 41 and 42 at a predetermined flow rate, respectively. Further, the $N_2$ gas is also discharged from the separation gas supplying pipe 51 and the purge gas supplying pipes 72 and 73 at a predetermined flow rate, respectively. With this, the vacuum chamber 10 is adjusted to a predetermined set pressure by the pressure regulator 650. Then, the wafers W are heated to be a range between 250° C. to 350° C., for example, by the heater unit 7 while rotating the turntable 2 in a clockwise direction at a maximum rotational speed of 240 rpm.

(ZrO Deposition Step 200)

Subsequently, the TEMAZ gas is supplied from the reaction gas nozzle 31 by opening the open valve V1 and closing the open valve V3 shown in FIG. 3, and the $O_3$ gas is supplied from the reaction gas nozzle 32, to the vacuum chamber 10.

In FIGS. 6A to 6C, the ZrO deposition step is shown as 200. As shown in FIGS. 6A to 6C, the TEMAZ gas and the $O_3$ gas are supplied at the same time in the ZrO deposition step 200. Here, these gasses are separated by the separation area H (FIG. 4) so that they are almost not mixed at all in the vacuum chamber 10.

While supplying the TEMAZ gas and the $O_3$ gas at the same time, the TEMAZ gas is adsorbed onto a surface of the wafer W when the wafer W passes through the first process area P1 and the adsorbed TEMAZ gas onto the surface of the wafer W is oxidized by the $O_3$ gas when the wafer W passes through the second process area P2, by the rotation of the turntable 2, so that a ZrO film is formed on the surface of the wafer W.

Thereafter, the turntable 2 is rotated for predetermined times until the ZrO film with a desired thickness is formed. Then, the ZrO deposition step 200 is finished when terminating supply of the TEMAZ gas and the $O_3$ gas. The number of rotations of the turntable 2 for forming the ZrO film may be about 40 times. At this time, the thickness of the ZrO film is about 3 nm, for example.

(AlO Deposition Step 1: TMA Gas Adsorption Step 202)

Subsequently, the TMA gas is supplied from the reaction gas nozzle 31 by closing the open valve V1 and opening the open valve V3 shown in FIG. 3, to the vacuum chamber 10.

In FIGS. 6A to 6C, the TMA gas adsorption step is shown as 202. At this time, neither $O_3$ gas nor any other reaction gasses are supplied from the reaction gas nozzle 32. However, noble gas such as Ar, He or the like or inactive gas such as nitrogen gas or the like may be supplied from the reaction gas nozzle 32. It means that in the TMA gas adsorption step 202, only the TMA gas is supplied as the reaction gas. Here, the $N_2$ gas is continuously supplied from the separation gas nozzles 41 and 42, the separation gas supplying pipe 51, and the purge gas supplying pipes 72 and (the same in the following steps).

The TMA gas is adsorbed onto the surface of the wafer W (ZrO film) when the wafer W passes through the first process area P1 by the rotation of the turntable 2. Thereafter, the wafer W is moved to the second process area P2 via the separation space H (FIG. 4). As neither $O_3$ gas nor any other reaction gasses are supplied from the reaction gas nozzle 32, the TMA gas adsorbed onto the surface of the wafer W does not decompose or react even when the wafer W passes through the second process area P2. Thereafter, the wafer W is moved back to the first process area P1 after passing through the other separation space H. Then, the same operation is repeated, and the TMA gas is adsorbed onto the entire surface of the wafer W (ZrO film) for a single molecular (atomic) layer. For example, in the TMA gas adsorption step 202, the turntable 2 may be rotated for 15 seconds when the rotational speed of the turntable 2 is 12 times/minute (in other words, 3 times).

In the above described temperature range of the wafers W, the TMA gas is almost self-aligned on the surface of the wafer W. It means that the TMA gas adsorbs onto the surface of the wafer W, however, it does not adsorb onto the TMA gas which is adsorbed onto the surface of the wafer W, and further does not decompose by heat on the surface of the wafer W. Thus, even when the wafer W passes through the first process area P1 plural times, the entire surface of the wafer W is covered by the TMA gas at almost a single molecular layer.

(AlO Deposition Step 2: TMA Gas Oxidization Step 204)

Then, supplying of the TMA gas from the reaction gas nozzle 31 is terminated by closing the open valve V3 shown in FIG. 3 (while keeping the open valve V1 closed), and the $O_3$ gas is supplied from the reaction gas nozzle 32, to the vacuum chamber 10 (second process area P2).

In FIGS. 6A to 6C, the TMA gas oxidization step is shown as 204. As shown in FIGS. 6A to 6C, neither the TMA gas, the TEMAZ gas, nor any other reaction gasses are supplied from the reaction gas nozzle 31 and only the $O_3$ gas is supplied from the reaction gas nozzle 32 in the TMA gas oxidization step 204 as the reaction gas. However, the noble gas such as Ar, He or the like or the inactive gas such as nitrogen gas or the like may be supplied from the reaction gas nozzle 32.

Under a condition where only the $O_3$ gas is supplied as the reaction gas, when the wafer W is moved to the second process area P2, the TMA gas adsorbed onto the surface of the wafer W is oxidized by the $O_3$ gas. Then, when the wafer W passes through the second process area P2 plural times by the rotation of the turntable 2, almost all of the TMA gas molecules adsorbed on the surface of the wafer W are oxidized to form an AlO film with a thickness of almost a single molecular layer on the entire surface of the wafer W (ZrO film). The thickness of the AlO film is about 0.1 nm. After a sufficient period has passed for oxidizing the TMA gas, supplying of the $O_3$ gas is terminated and the TMA gas oxidization step 204 is finished. For example, in the TMA gas oxidization step 204, the turntable 2 may be rotated for 30 seconds when the rotational speed of the turntable 2 is 12 times/minute (in other words, 6 times).

Thereafter, the above described ZrO deposition step 200, the TMA deposition step (TMA gas adsorption step 202 and the TMA gas oxidization step 204) are repeated for a predetermined number of times to form an Al doped ZrO film with a desired thickness. Subsequently, supplying of the gasses to the vacuum chamber 10 is terminated, the rotation of the turntable 2 is terminated, and then the wafers W are exported from the vacuum chamber 10 by a method in reverse of that performed when transferring the wafers W into the vacuum chamber 10. With this, the deposition step is finished.

As described above, according to the film deposition method of the embodiment, a multilayer Al doped ZrO film is obtained in which the AlO film with the thickness of the single molecular layer is periodically inserted between the ZrO films each having a predetermined thickness and including the plural layers formed in the ZrO deposition step 200. As the AlO film with the thickness of the single molecular layer is uniformly formed, the thicknesses of the AlO films between the plural wafers W or the thickness of the AlO film in each of the wafers W become uniform in-plane. Further, the Al added amount can be adjusted by the number of films to be inserted into the ZrO films. Thus, a film deposition method capable of improving controllability and uniformity of an added amount of Al can be provided. Therefore, a high dielectric film with a relatively large relative dielectric constant and good leak characteristics (high withstand voltage) can be obtained.

Generally, in the ALD apparatus with the turntable (especially in the ALD apparatus with the turntable in which the reaction gasses are capable of being separated such as the film deposition apparatus 1), similar to the above described ZrO deposition step 200, it is not necessary to alternately supply the TMA gas, which is the additional reaction gas, and the $O_3$ gas. Thus, the TMA gas and the $O_3$ gas are supplied to the chamber at the same time while rotating the turntable on which wafers are mounted so that each of the wafers is alternately exposed to the TMA gas and the $O_3$ gas to deposit a molecular layer film. As the gasses can be supplied at the same time, evacuation/purging steps for each of the reaction gases is unnecessary to shorten the process time. This is one of the advantages of the ALD apparatus with the turntable compared with the batch ALD apparatus or a single wafer processing type ALD apparatus with a shower head.

However, according to the TMA deposition step of the embodiment, a step in which only the TMA gas is supplied without supplying the $O_3$ gas (TMA gas adsorption step 202) and a step in which only the $O_3$ gas is supplied without supplying the TMA gas (TMA gas oxidization step 204) are provided in the film deposition apparatus 1 with the turntable. The mechanism is described as follows.

If the TMA gas and the $O_3$ gas are supplied at the same time in the AlO deposition step, the TMA gas adsorbed on the surface of the wafer W at the first process area P1 is oxidized in the second process area P2 so that AlO is formed on the surface of the wafer W. In such a case, when the wafer W is moved to the first process area P1 again, the TMA gas is also adsorbed onto the AlO. Then, the adsorbed TMA gas is oxidized again in the second process area P2 so that AlO is formed again. It means that the AlO film with a thickness of two molecular layers may be formed on the surface of the wafer W. As it is difficult to strictly control timing of supplying the TMA gas to the wafers W mounted on the turntable 2 which is being rotated, there may be a possibility that the number of molecular layers of Alo varies between the wafers W or within each of the wafers W on the turntable 2.

Specifically, for example, it is assumed that the TMA gas is started to be supplied from the reaction gas nozzle 31 when the first one of five wafers W mounted on the turntable 2 reaches the first process area P1. In this case, the number of the molecular layers of AlO between the wafers W cannot be made uniform unless supplying of the TMA gas is terminated just before the first wafer W reaches the first process area P1 again while the turntable 2 is rotated. If supplying of the TMA gas is terminated at a timing when a first wafer W passes through the first process area P1 again, AlO of two molecular layers is formed on the first wafer W while AlO of only a single molecular layer is formed on a second wafer W which is downstream of the first wafer W in the rotation direction of the turntable 2. Thus, there is a variation in the number of molecular layers of the AlO films between the wafers W.

Further, if supplying of the TMA gas is terminated at a timing when a part of the wafer W reaches the first process area P1, there are parts where the AlO film with the thickness of two molecular layers and the AlO film with the thickness of only the single molecular layer are formed within the in-plane of the wafer W. It means that the numbers of the molecular layers of AlO cannot be made uniform between the wafers W or within each of the wafers W, unless supplying of the TMA gas is terminated just before a part, which is first exposed to the TMA gas just after supplying of the TMA gas is started, reaches the first process area P1 so as to be exposed to the TMA gas again while the turntable 2 is rotated. However, it is almost impossible to control such a timing when the turntable 2 is rotated (at a rotational speed of over 200 rpm in some case).

On the other hand, according to the film deposition method of the embodiment, the TMA gas adsorption step 202 and the TMA gas oxidization step 204 are provided for the film deposition apparatus with the turntable 1, Al can be controlled to uniformly be provided to the ZrO films between the wafer W and within each of the wafers. Especially, when the relative dielectric constant varies largely depending on the added amount of Al, as the case of the Al doped ZrO film, the film deposition method of the embodiment has a large advantage.

The film deposition method of the embodiment may be used when adding a slight amount of Al as impurity into a ZrO film, which is a high dielectric portion. Here, the slight amount may be, greater than or equal to 1 atom % and less than 50 atomic %, and more preferably, greater than or equal to 1 atomic % and less than or equal to 30 atomic %, for example.

Further, in this embodiment, a step is repeated in which the TMA gas adsorption step is performed for a period in which the turntable 2 is rotated for N times (N=3 for the above explained example) and the TMA gas oxidization step is subsequently performed for a period in which the turntable 2 is rotated for L times (L<M, L=6 for the above explained example) for every time the ZrO film (second thin film) deposition step is performed for a period in which the turntable 2 is rotated for M time (M=60 for the above explained example, N<M).

Further, the film deposition method of the embodiment is preferably performed in the film deposition apparatus 1 with the turntable. The film deposition apparatus 1 has the following advantages compared with the single wafer processing type film deposition apparatus with a "shower head", for example.

In the single wafer processing type film deposition apparatus, a relatively long period is necessary to start supplying of the TMA gas after terminating supply of the TEMAZ gas in order to purge the TEMAZ gas remaining in the shower head. Further, as the relative dielectric constant of a formed film varies largely depending on the added amount of Al, it is important to control the added amount of Al. Thus, if the TEMAZ gas is supplied when the TMA gas remains in the shower head, a film with a desired relative dielectric constant cannot be obtained. However, according to the reaction gas nozzles 31 and 32 of the film deposition apparatus 1, gasses do not remain and changing of gasses is easier compared with the shower head.

Further, when the shower head is used, the gas is supplied from a lot of gas discharge ports provided in the shower head. However, it is not easy to uniformly supply the gas from these gas discharge ports. Thus, when a part where the supplying amount of the TMA gas is small is generated in the shower head, it takes a long time to have the TMA gas adsorbed onto that part of the surface of the wafer.

On the other hand, according to the film deposition apparatus 1, the in-plane gas concentration distribution with respect to the wafer W is determined based on the rotation of the turntable 2 and the reaction gas nozzle 31 or 32. Thus, it is easier to uniformly supply the TMA gas with respect to the wafer W. In other words, for the case using the shower head, it is necessary to provide the uniform in-plane gas concentration distribution by the gas shower head, while according to the film deposition apparatus 1, it is only necessary to provide a uniform line gas concentration distribution by the alignment of the gas discharge holes 33 (FIG. 4) of the reaction gas nozzle 31 or 32.

Examples are explained.

Example 1

The added amount of Al is determined.

An Al doped ZrO film is formed on a silicon wafer by changing a ratio between the rotation number of the turntable 2 in the ZrO deposition step and the rotation number of the turntable 2 in the TMA gas adsorption step. Here, the ratio of the rotation numbers (the rotation number of the turntable 2 in the ZrO deposition step: the rotation number of the turntable 2 in the TMA gas adsorption step) are set to be (7:1), (10:1), or (16:1).

The thicknesses of the ZrO film and the AlO film in each of the obtained films are measured, and the added amount of Al in the films are measured by Rutherford Backscattering Spectrometry (RBS).

Figure 7A:
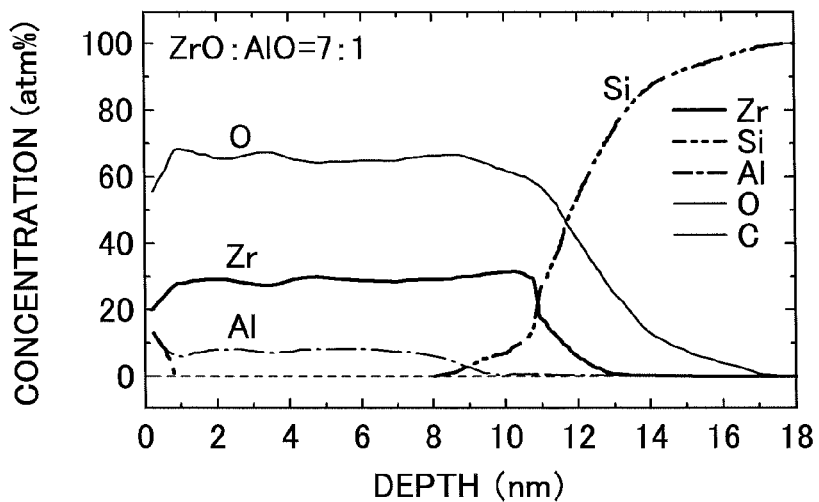
FIG. 7A to FIG. 7C are views showing a result of an example.
Figure 7B:
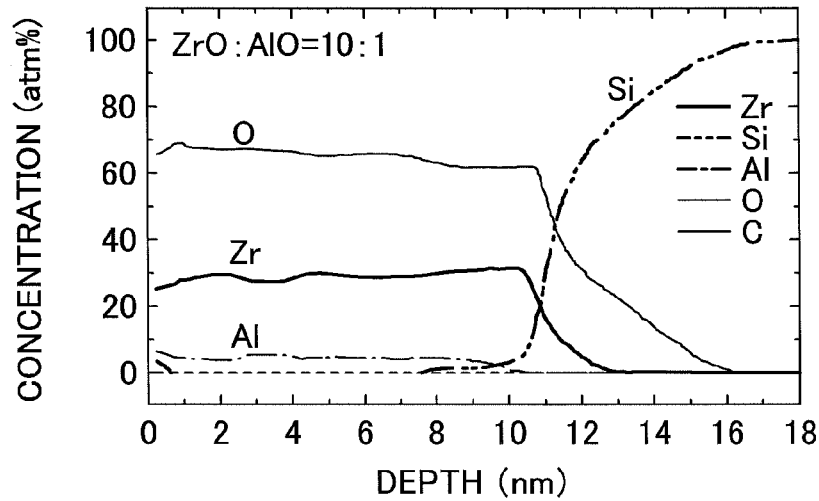
Figure 7C:
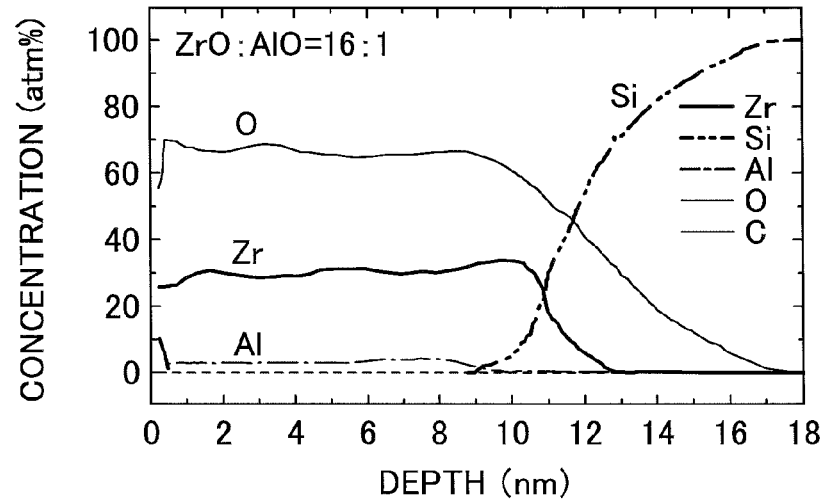

FIG. 7A to FIG. 7C are graphs each showing depth profiles of concentrations of main elements obtained by RBS. As can be understood from these graphs, the concentrations of Zr, oxygen (O), and Al are almost constant in a depth direction for any of the ratio of the rotation numbers. It means that the Al doped ZrO film having a uniform composition ratio in the thickness direction can be obtained. Further, in all of the samples, the total thickness of the Al doped ZrO film is about 11 nm. It means that the total thickness can be controlled even when the ratio of the rotation numbers is varied.

Figure 8:
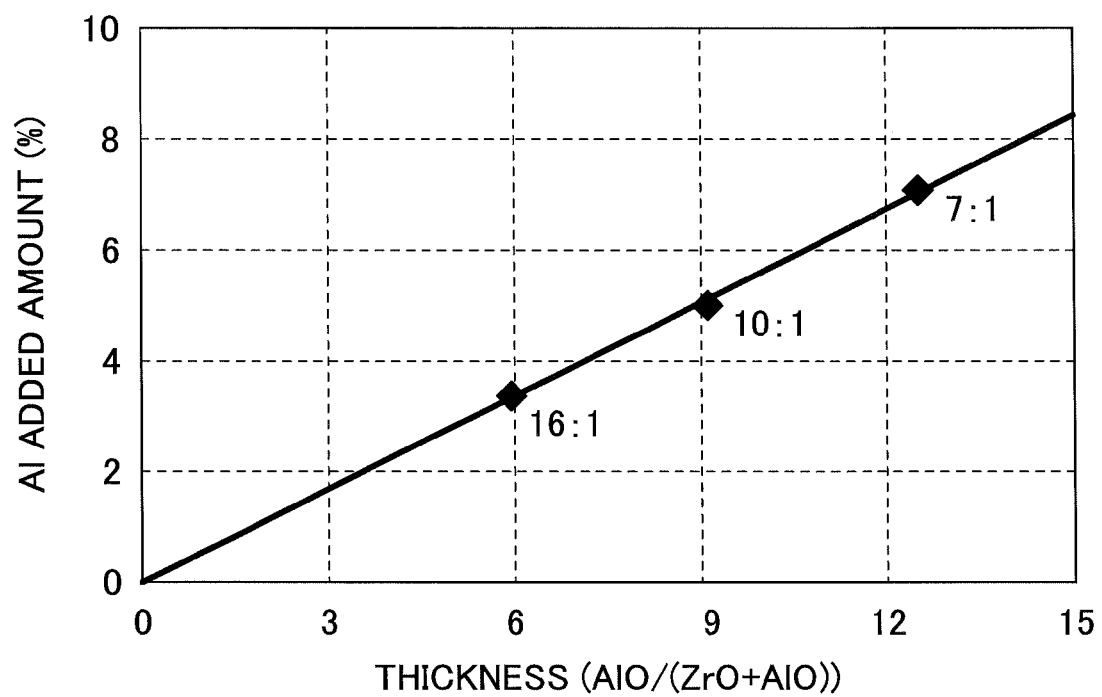
FIG. 8 is a graph showing a result of an example.

FIG. 8 is a view showing a relationship between the Al added amount and the thickness of the AlO film. In the graph of FIG. 8, the axis of abscissa shows a thickness of the AlO film formed by a single TMA deposition step with respect to the total thickness of the ZrO film and the AlO film formed by the single ZrO deposition step. The axis of ordinates shows the Al added amount obtained by RBS. As shown in this graph, Al added amounts of the three different ratios of the rotation numbers are provided on a line which passes through an origin. Further, a fitting by the least-squares method with respect to the graph shows a result of y=0.56×x, $R^2$=1.00. With this result, it can be understood that a high controllability of the Al added amount can be obtained according to the film deposition method of the embodiment.

Example 2

Figure 9:
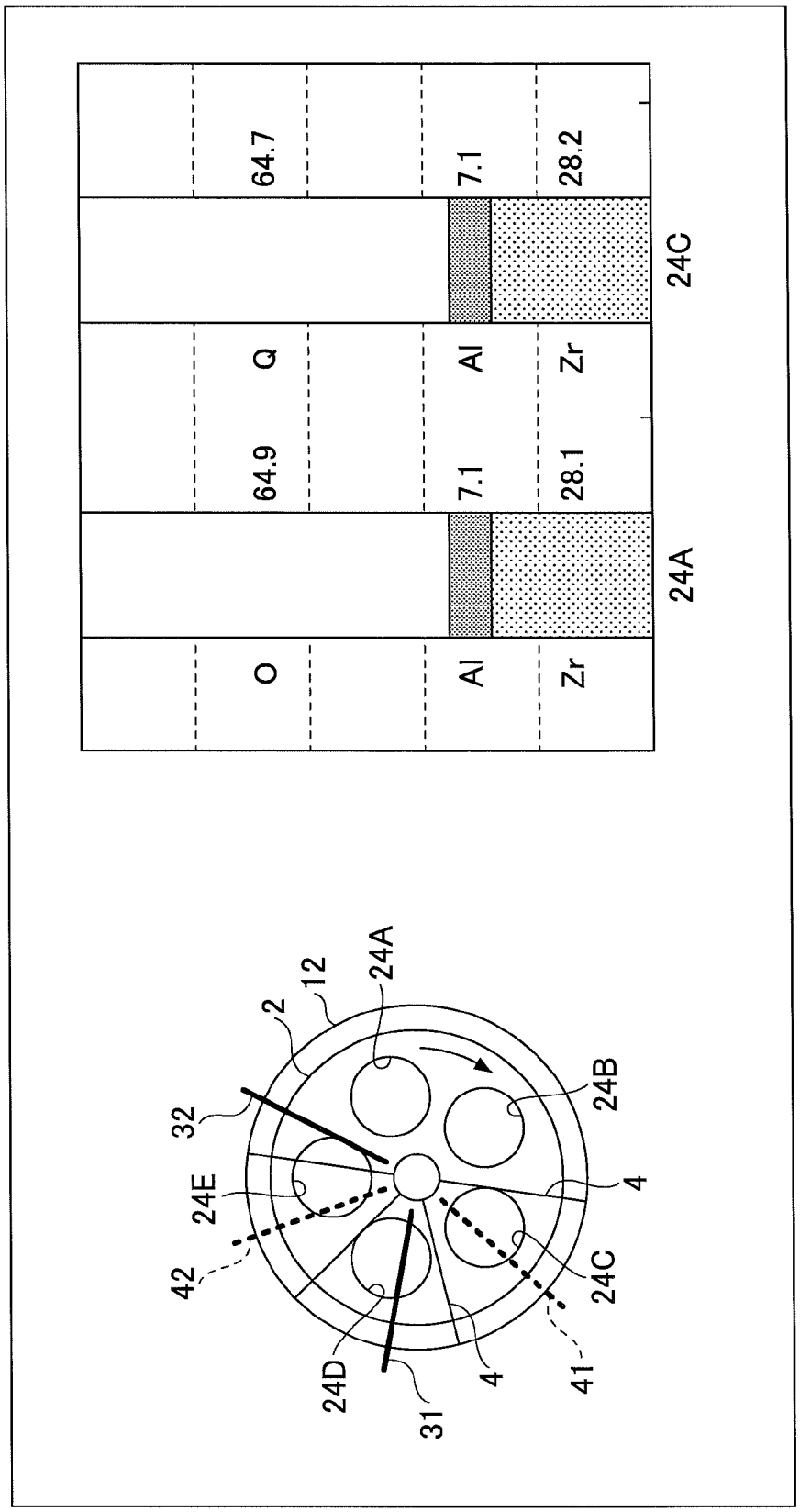
FIG. 9 is a view showing a result of an example.

Then, across-the-wafer uniformity between the five wafers W mounted on the turntable 2 is examined. FIG. 9 shows the result.

Specifically, composition analysis's by RBS are performed for the two wafers which are mounted on the concave portion 24A and the concave portion 24C, which is positioned second from the concave portion 24A along the rotation direction of the turntable 2, respectively, among the five wafers obtained when the ratio of the rotation numbers is 7:1. As a result, as shown in FIG. 9, the Al added amounts are the same for the two wafers mounted on the concave portion 24A and the concave portion 24C, respectively. With this result, it can be understood that Al can be uniformly added regardless of the mounted positions of the wafers W on the turntable 2.

The present invention is not limited to the specifically disclosed embodiments, and variations and modifications may be made without departing from the scope of the present invention.

For example, in the film deposition apparatus 1, as shown in FIG. 3, the first gas supplying source 121 of the TEMAZ gas and the second gas supplying source 123 of the TMA gas are connected to the reaction gas nozzle 31 and these are alternatively supplied. Further, in addition to these, a gas supplying source for supplying inactive (or noble) gas may be connected via a mass flow controller and an open valve and the TEMAZ gas, the TMA gas, and the inactive gas may be alternatively supplied from the reaction gas nozzle 31.

Further, the film deposition apparatus 1 may be configured such that the $O_3$ gas and inactive (or noble) gas is alternatively supplied from the reaction gas nozzle 32. With this structure, a purging step of supplying the inactive gas may be provided after the TEMAZ gas and the $O_3$ gas are supplied at the same time, after the TMA gas is supplied, and/or after the $O_3$ gas is supplied.

Figure 10:
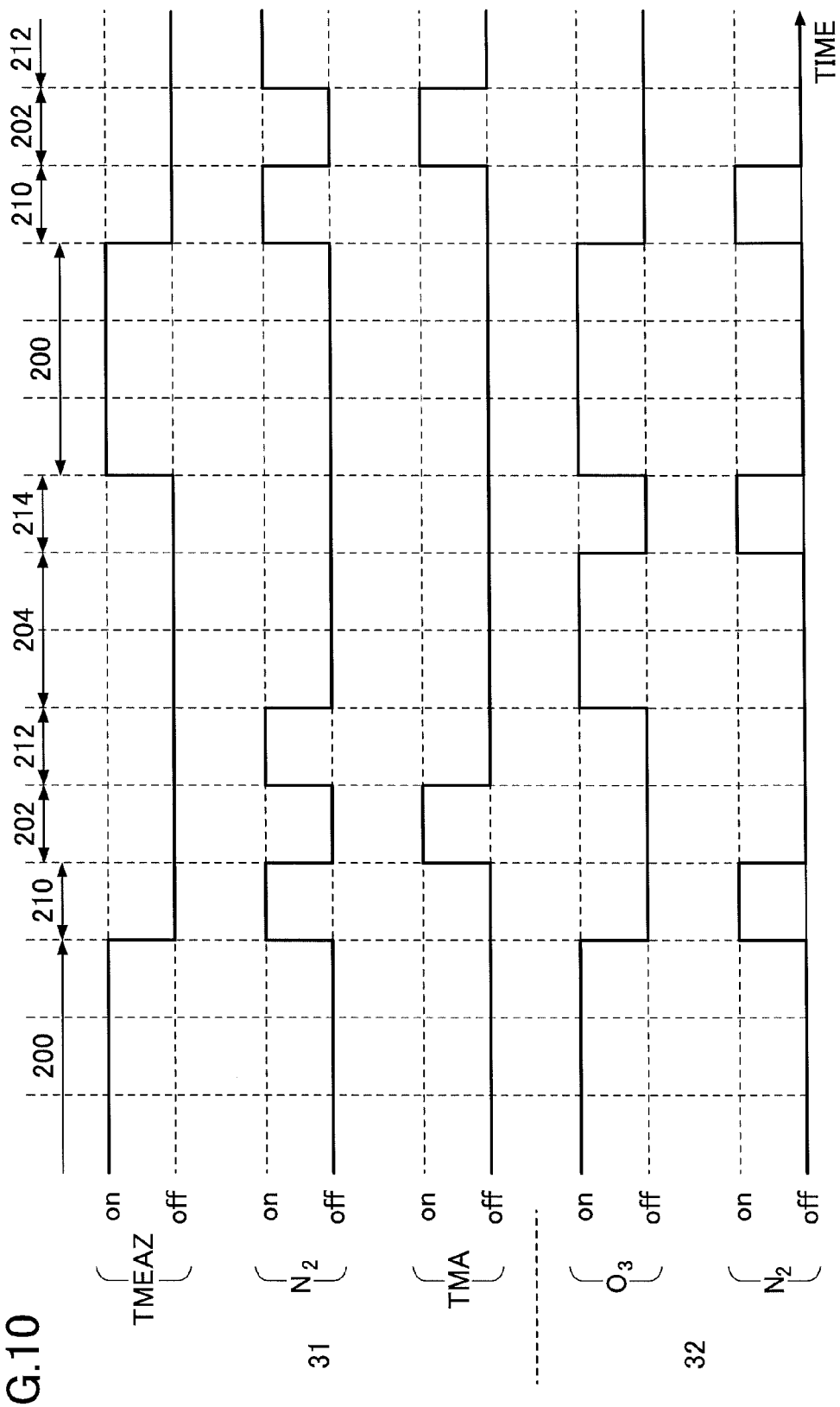
FIG. 10 is a timing chart for explaining a film deposition method of another embodiment.

FIG. 10 shows this example. Specifically, after the TEMAZ gas and the $O_3$ gas are supplied at the same time in the ZrO deposition step 200, supplying of these gasses are terminated, and then the inactive gas is supplied from the reaction gas nozzle 31 and the inactive gas is supplied from the reaction gas nozzle 32 in a first purging step 210.

Further, after the TMA gas is supplied in the TMA gas adsorption step 202, supplying of the TMA gas is terminated and the inactive gas is supplied from the reaction gas nozzle 31 in a second purging step 212.

Further, after the $O_3$ gas is supplied in the TMA gas oxidization step 204, supplying of the $O_3$ gas is terminated and the inactive gas is supplied from the reaction gas nozzle 32 in a third purging step 214.

With this operation, the gasses remaining in the reaction gas nozzle 31 after the TEMAZ gas or the TMA gas is supplied can be purged by the inactive gas, and the $O_3$ gas remaining in the reaction gas nozzle 32 after the $O_3$ gas is supplied can be purged by the inactive gas. Especially, by purging the TEMAZ gas remaining in the reaction gas nozzle 31 after the TEMAZ gas is supplied by the inactive gas, a possibility that the TEMAZ gas is mixed into the TMA gas when the TMA gas is supplied can be reduced so that the TMA gas can be confidently adsorbed on the surface of the wafer W.

Further, it is not necessary to perform all of the first purging step 210, the second purging step 212, and the third purging step 214, and only one of or two of them may be performed. Further, for the inactive gas, $N_2$ gas or Ar gas may be used. Further, the inactive gas supplied from the reaction gas nozzle 31 may be $N_2$ gas, while the inactive gas supplied from the reaction gas nozzle 32 may be Ar gas.

Further, for the case when the above described purging steps are performed, the thickness of the Al doped ZrO film can be preferably controlled while the thickness of the in-plane across-the-wafer uniformity can be obtained.

Figure 11:
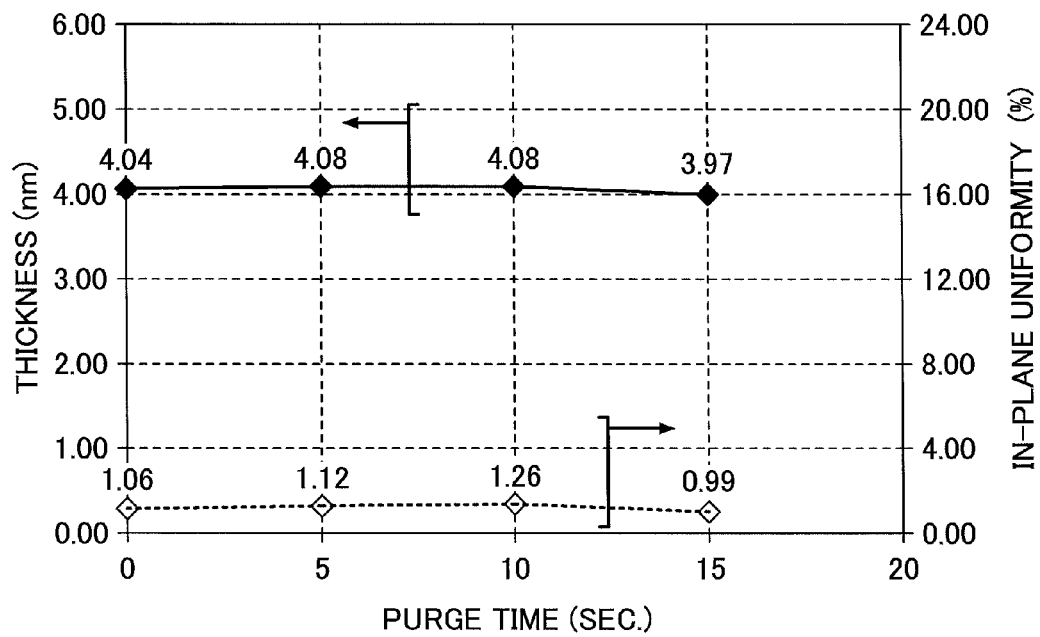
FIG. 11 is a graph showing a result of an example.

FIG. 11 is a graph showing a relationship between the thickness of the Al doped ZrO film and the in-plane uniformity when the period of the second purging step 212 (the purging step after the TMA gas is supplied) is varied. As can be understood from the graph, when the period of the second purging step 212 is varied from 0 second (without the second purging step), 5 seconds, 10 seconds, and 15 seconds, the thickness of the Al doped ZrO film does not change, and the in-plane uniformity of the thickness is good.

Figure 12:
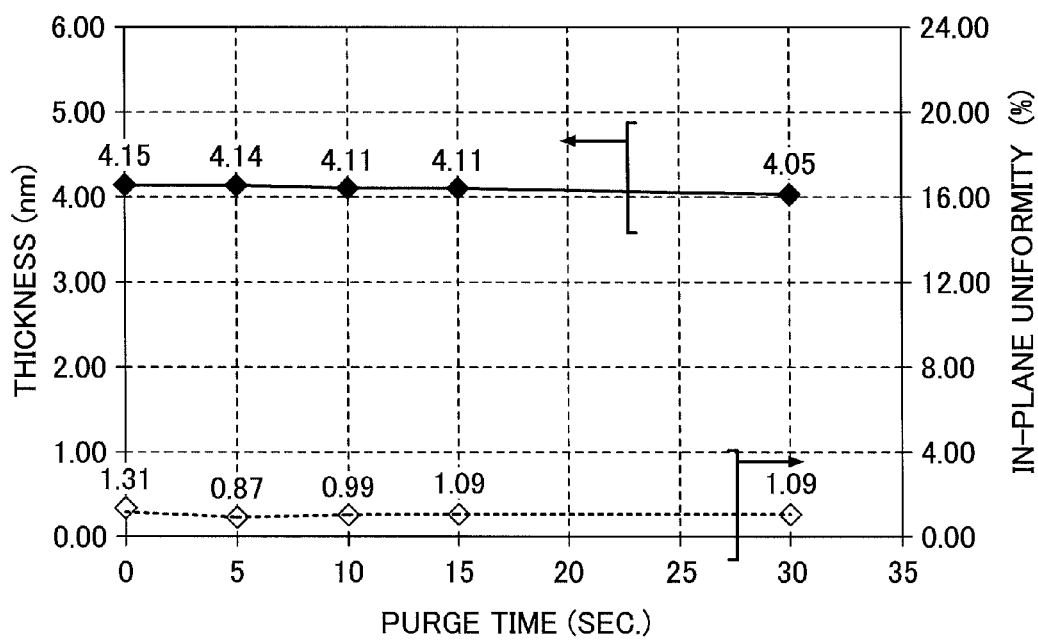
FIG. 12 is a graph showing a result of an example.

FIG. 12 is a graph showing a relationship between the thickness of the Al doped ZrO film and the in-plane uniformity when the period of the third purging step 214 (the purging step after the $O_3$ gas is supplied) is varied. As can be understood from the graph, when the period of the third purging step 214 is varied from 0 second (without the third purging step), 5 seconds, 10 seconds, 15 seconds, and 30 seconds, the thickness of the Al doped ZrO film does not change, and the in-plane uniformity of the thickness is good.

Here, the Al added amount in the Al doped ZrO film can be appropriately controlled without these purging steps, as explained above.

As the relative dielectric constants are almost the same and there is not a significant difference between the dielectric constants for the Al doped ZrO films for which the period of the TMA gas adsorption step is different, it can be understood that the AlO film with a single molecular layer is formed (the TMA gas is self-aligned to be adsorbed) according to the TMA gas adsorption step 202 and the TMA gas oxidization step 204.

As described above, for the case where the TEMAZ gas, the TMA gas, and the inactive gas are alternatively supplied from the reaction gas nozzle 31, and the $O_3$ gas and the inactive gas are alternatively supplied from the reaction gas nozzle 32, the inactive gas may be supplied from the reaction gas nozzle 32 in the TMA gas adsorption step 202 (FIGS. 6A to 6C), or the inactive gas may be supplied from the reaction gas nozzle 31 in the TMA gas oxidization step 204 (FIGS. 6A to 6C), for example.

Further, in the above embodiment, the $O_3$ gas is used for oxidizing the TEMAZ gas or the TMA gas adsorbed onto the surface of the wafer W. However, instead of the $O_3$ gas, oxygen ($O_2$) plasma, NOx gas, $H_2O$ gas or the like may be used. When the $O_2$ plasma is used, a plasma generating source may be provided in the vacuum chamber 10. For the plasma generating source, two rod electrodes which are in parallel relationship with each other and also in parallel relationship with the turntable 2 may be provided in the vacuum chamber 10 and the $O_2$ plasma may be generated by supplying $O_2$ gas to a space between the electrodes while supplying high-frequency power between the electrodes. Further, Inductively Coupled Plasma (ICP) may be used as the plasma generating source instead of such a capacitive coupling plasma (CCP).

Further, although the TEMAZ gas and the TMA gas are exemplified as the Zr containing organometallic gas and the Al containing organometallic gas, respectively, in the above embodiment, other source gas containing zirconium such as tri(Dimethylamino) cyclopentadienyl zirconium or the like, and source gas containing aluminum (organometallic aluminum) such as triethyl aluminum or the like may be used, respectively.

Further, although the ZrO film is exemplified in the above embodiment, the film deposition method of the embodiment may be applied when uniformly and controllably adding impurity into oxide film of tantalum (Ta), hafnium (Hf), lanthanum (La), strontium (Sr), titanium (Ti), niobium (Nb), or silicon (Si).

According to the embodiment, a film deposition method capable of improving controllability and uniformity of an added amount is provided.

Although a preferred embodiment of a film deposition method has been specifically illustrated and described, it is to be understood that minor modifications may be made therein without departing from the spirit and scope of the invention as defined by the claims.

What is claimed is:

1. A film deposition method of forming a first thin film of a reaction product of a first reaction gas and a second reaction gas on a substrate, performed in a film deposition apparatus including,
   a turntable rotatably provided in a vacuum chamber and having plural mounting portions on each of which a substrate is to be mounted,
   a first gas supplying portion to supply a reaction gas to a first process area on the surface of the turntable,
   a second gas supplying portion to supply a reaction gas to a second process area which is apart from the first process area along a circumferential direction on the surface of the turntable, and
   a separation gas supplying portion to supply a separation gas to separation areas provided between the first process area and the second process area on the surface of the turntable,
   the method comprising:
   an adsorption step of adsorbing the first reaction gas onto the substrate by supplying the first reaction gas from the first gas supplying portion for a predetermined period without supplying a reaction gas from the second gas supplying portion while separating the first process area and the second process area by supplying the separation gas from the separation gas supplying portion and rotating the turntable; and
   a reaction step of having the first reaction gas adsorbed onto the substrate react with the second reaction gas by supplying the second reaction gas from the second gas supplying portion for a predetermined period without supplying a reaction gas from the first gas supplying portion while separating the first process area and the second process area by supplying the separation gas from the separation gas supplying portion and rotating the turntable.

2. The film deposition method according to claim 1, further comprising:
   a first inactive gas supplying step, performed after the adsorption step, of supplying an inactive gas from the first gas supplying portion for a predetermined period without supplying a reaction gas from the second gas supplying portion while separating the first process area and the second process area by supplying the separation gas from the separation gas supplying portion and rotating the turntable.

3. The film deposition method according to claim 1, further comprising:
   a second inactive gas supplying step, subsequently performed after the reaction step, of supplying an inactive gas from the second gas supplying portion for a predetermined period without supplying a reaction gas from the first gas supplying portion while separating the first process area and the second process area by supplying the separation gas from the separation gas supplying portion and rotating the turntable.

4. The film deposition method according to claim 1, further comprising;
   a second thin film forming step, performed prior to the adsorption step, of forming a reaction product of a third reaction gas and a fourth reaction gas on the substrate by supplying the third reaction gas from the first gas supplying portion and supplying the fourth reaction gas from the second gas supplying portion simultaneously while separating the first process area and the second process area by supplying the separation gas from the separation gas supplying portion and rotating the turntable.

5. The film deposition method according to claim 4, wherein the first reaction gas is a gas containing aluminum, the second reaction gas is a gas containing oxygen, the third reaction gas is a gas containing zirconium, and the fourth reaction gas is a gas containing oxygen.

6. The film deposition method according to claim 4, wherein the first reaction gas is an organometallic source gas containing aluminum, the second reaction gas is an oxygen gas or an ozone gas, the third reaction gas is an organometallic source gas containing zirconium, and the fourth reaction gas is an oxygen gas or an ozone gas.

7. The film deposition method according to claim 4, wherein the first reaction gas includes atoms to be doped into the second thin film.

8. The film deposition method according to claim 4, wherein a step in which the adsorption step is performed for a period in which the turntable is rotated N times and subsequently the reaction step is performed, every time the second thin film forming step is performed for a period in which the turntable is rotated M times (N<M) is repeated.

9. The film deposition method according to claim 4, wherein the second thin film is a high dielectric film, and the first thin film includes atoms to be doped into the high dielectric film.

10. The film deposition method according to claim 4, wherein the second thin film is a ZrO film, and the first thin film includes Al to be doped into the ZrO film.

11. The film deposition method according to claim 1, further comprising:
a third inactive gas supplying step, performed prior to the adsorption step, of supplying an inactive gas from the second gas supplying portion for a predetermined period without supplying a reaction gas from the first gas supplying portion while separating the first process area and the second process area by supplying the separation gas from the separation gas supplying portion and rotating the turntable.

12. The film deposition method according to claim 1, wherein the film deposition apparatus includes a ceiling plate to provide a ceiling surface which forms a space with respect to the surface of the turntable for introducing the separation gas supplied from the separation gas supplying portion toward the first process area and the second process area, the ceiling place being formed to provide the ceiling surface having a shape in which a width in the circumferential direction becomes larger in a direction toward the outside of the turntable.

* * * * *